United States Patent
Chae et al.

(10) Patent No.: US 9,231,649 B2
(45) Date of Patent: *Jan. 5, 2016

(54) METHOD FOR GENERATING UNAMBIGUOUS CORRELATION FUNCTION FOR TMBOC(6,1,4/33) SIGNAL BASED ON EQUALLY SPLIT PARTIAL CORRELATION FUNCTIONS, APPARATUS FOR TRACKING TMBOC SIGNALS AND SATELLITE NAVIGATION SIGNAL RECEIVER SYSTEM

(71) Applicant: Research & Business Foundation SUNGKYUNKWAN UNIVERSITY, Suwon-si (KR)

(72) Inventors: Keun Hong Chae, Suwon-si (KR); Seok Ho Yoon, Suwon-si (KR)

(73) Assignee: Research & Business Foundation SUNGKYUNKWAN UNIVERSITY, Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/546,364

(22) Filed: Nov. 18, 2014

(65) Prior Publication Data

US 2015/0222415 A1  Aug. 6, 2015

(30) Foreign Application Priority Data

Nov. 19, 2013  (KR) .................. 10-2013-0140686

(51) Int. Cl.
*H04B 1/16* (2006.01)
*H04B 1/709* (2011.01)
*H03L 7/06* (2006.01)
(Continued)

(52) U.S. Cl.
CPC *H04B 1/709* (2013.01); *H03L 7/06* (2013.01);
*H04B 1/16* (2013.01); *H04B 1/707* (2013.01);
*H04L 27/00* (2013.01); *H04L 27/2272*
(2013.01); *G01S 19/24* (2013.01); *G01S 19/30*
(2013.01); *H04J 13/00* (2013.01)

(58) Field of Classification Search
CPC ......... G01S 19/30; G01S 19/24; G01S 19/29;
G01S 19/33; G01S 19/37; H04B 2201/70715;
H04B 1/707; H04B 1/7075; H04B 1/709;
H04B 2207/70707; H04J 13/00; H04J 13/10
See application file for complete search history.

(56) References Cited

U.S. PATENT DOCUMENTS

2005/0281325 A1* 12/2005 Lillo et al. .................. 375/150
2007/0258511 A1* 11/2007 Knight et al. ............... 375/149
(Continued)

*Primary Examiner* — Leon-Viet Nguyen
(74) *Attorney, Agent, or Firm* — NSIP Law

(57) ABSTRACT

A method of generating the correlation function of a TMBOC (6,1,4/33) signal according to the present invention includes generating a signal delayed based on a phase delay τ with respect to a signal pulse train of a TMBOC(6,1,4/33)-modulated received signal, generating 12 partial correlation functions by performing the autocorrelation operation of the received signal and the delayed signal with respect to a total time $T(0 \le t \le T)$, generating a sub-correlation function by performing an elimination operation of sixth and seventh partial correlation functions, and generating a main correlation function by summing results obtained by performing elimination operations between the remaining 10 partial correlation functions, excluding the sixth and seventh early partial correlation functions from the 12 partial correlation functions, and the sub-correlation function. The elimination operation is an operation satisfying algebraic relations in which $|A|+|B|-|A-B|=0$ when real numbers A and B are $AB \le 0$ and $|A|+|B|-|A-B|>0$ when the real numbers A and B are $AB>0$.

12 Claims, 9 Drawing Sheets

(51) Int. Cl.
*H04L 27/227* (2006.01)
*H04B 1/707* (2011.01)
*H04L 27/00* (2006.01)
*H04J 13/00* (2011.01)
*G01S 19/30* (2010.01)
*G01S 19/24* (2010.01)

(56) References Cited

U.S. PATENT DOCUMENTS

2009/0279592 A1* 11/2009 Pratt et al. .................. 375/148
2010/0061427 A1*  3/2010 Lopez-Risueno et al. .... 375/150
2011/0261805 A1* 10/2011 Landry et al. ............... 370/342

* cited by examiner

METHOD FOR GENERATING UNAMBIGUOUS CORRELATION FUNCTION FOR TMBOC(6,1,4/33) SIGNAL BASED ON EQUALLY SPLIT PARTIAL CORRELATION FUNCTIONS, APPARATUS FOR TRACKING TMBOC SIGNALS AND SATELLITE NAVIGATION SIGNAL RECEIVER SYSTEM

CROSS-REFERENCE TO RELATED APPLICATONS

The application claims the benefit under 35 U.S.C. §119(a) of Korean Patent Application No. 10-2013-0140686, filed on Nov. 19, 2013, in the Korean Intellectual Property Office, the entire disclosures of which are incorporated herein by reference for all purposes.

BACKGROUND

1. Technical Field

The present invention relates generally to satellite navigation technology and, more particularly, to a scheme for tracking a time-multiplexed binary offset carrier (TMBOC) signal that is used for satellite navigation technology.

2. Description of the Related Art

Satellite navigation technology is technology that is configured such that when a plurality of navigation satellites randomly transmit a plurality of satellite navigation signals, each containing information about the current location and time of the corresponding navigation satellite, to the ground, a satellite navigation receiver on the ground receives the plurality of satellite navigation signals, calculates the coordinates of the current locations of the navigation satellites and the arrival times of the signals, and determines its three-dimensional (3D) location in the Earth coordinate system using triangulation.

A satellite navigation receiver theoretically requires at least three satellite signals in order to determine its longitude, latitude and height, and requires one more satellite signal in order to improve accuracy by eliminating time error between satellites. Accordingly, at least four satellites are required.

Across the world, many countries have developed independent satellite navigation systems for economic and military reasons. Although the United States Global Positioning System (GPS) is most widely used and famous, the European Union's Galileo system, the Russian GLONASS, the Chinese COMPASS system, and the Japanese QZSS system (which will be expanded to the JRANS system in the future) are also being currently operated or developed.

Since satellite navigation signals should be robust to interference and jamming, a variety of elaborate modulation schemes have been employed. It is worthy of notice that the majority of the next-generation satellite navigation systems have replaced a conventional a phase shift keying (PSK) modulation scheme or have employed a BOC modulation scheme in addition to a PSK modulation scheme. The width of the main peak of an autocorrelation function used for the BOC modulation scheme is short, and thus the BOC modulation scheme exhibits better signal tracking performance than the PSK modulation scheme.

Furthermore, the BOC modulation scheme is characterized in that spectral separation occurs and energy is shifted from the center of a band to the periphery thereof, unlike the PSK modulation scheme, and thus the BOC modulation scheme can be additionally applied to a band in which a conventional modulation scheme has been used. Using these characteristics, the next-generation satellite navigation systems can employ the BOC modulation scheme in addition to the PSK modulation scheme, thereby being able to ensure the improvement of performance and backward compatibility.

A BOC signal is a signal that is expressed as a product of a pseudo random noise (PRN) code with a sine or cosine rectangular sub-carrier. A BOC signal is expressed as a $BOC_{sin}(kn,n)$ or a $BOC_{cos}(kn,n)$ depending on the type of sub-carrier, where k is a positive integer indicative of the ratio of the chip period of a PRN code to the period of a sub-carrier, and n is indicative of the ratio of PRN code chip transmission rate to 1.023 MHz, that is, the clock frequency of a CA code.

Although a BOC signal has high signal tracking performance and excellent compatibility with the conventional PSK modulation scheme, it is problematic in that many side peaks occur around a main peak where an autocorrelation function has the highest value, unlike the PSK scheme having a single peak. A problem in which, upon tracking a BOC signal, synchronization is established with a side peak instead of a main peak due to the presence of side peaks, that is, the so-called ambiguity problem, may occur.

Meanwhile, in order to modernize the GPS system while maintaining its backward compatibility and provide compatibility between the GPS system and the Galileo system, a multiplexed BOC (MBOC) modulation method was proposed, and the U.S. and European authorities finally decided to adopt a so-called MBOC(6,1,1/11) modulation method in which a $BOC_{sin}(1, 1)$ signal and a $BOC_{sin}(6, 1)$ signal were combined at a power split ratio of 1/11 after discussion.

Interestingly, the U.S. and European authorities implemented different methods of synthesizing sub-carrier signals BOC(1,1) and BOC(6,1) that could satisfy the power spectrum density of the MBOC(6,1,111) modulation method. First, the U.S. authority implemented a time-multiplexed BOC (TMBOC) using two sub-carriers BOC(1,1) and BOC(6,1) in the time domain in an non-overlap manner. In contrast, the European authority implemented a composite BOC (CBOC) in which a sub-carrier BOC(6,1) has been added to a sub-carrier BOC(1,1) along the time axis.

Meanwhile, the TMBOC modulated signal is configured such that 75% of power is assigned to pilot components and 25% of the power is assigned to data components, thereby allowing BOC(1,1) spreading symbols to be used for data having no advantage attributable to high sub-carrier frequency. In contrast, the pilot components are configured to include 29/33 BOC(1,1) spreading symbols and 4/33 BOC(6, 1) spreading symbols, and thus an advantage attributable to the high frequency of a sub-carrier can be obtained via pilot components and also signal tracking performance can be improved.

Furthermore, the pilot components of the TMBOC modulated signal are stipulated such that BOC(6,1) spreading symbols are located at the four chip locations of the Nos. 1, 5, 7 and 30 chips of every 33 chips and BOC(1,1) spreading symbols are located at the remaining 29 chip locations (which is expressed as a TMBOC(6,1,4/33)). This 33 chip pattern is repeated 310 times, and thus a spreading code has a 10230 chip length.

The TMBOC(6,1,4/33) signal includes $BOC_{sin}(6,1)$ signal components at the ratio of 4 chips to 33 chips. Since the main peak of the autocorrelation function of the $BOC_{si}(6,1)$ signal components is sharper than the main peak of the autocorrelation function of the $BOC_{sin}(1,1)$ signal component, more excellent positioning accuracy can be provided.

However, the TMBOC(6,1,4/33) signal still has side peaks around the main peak of an autocorrelation function, and thus the ambiguity problem still remains.

SUMMARY

An object of the present invention is to provide a method of generating an unambiguous correlation function for a TMBOC(6,1,4/33) signal based on equally split partial correlation functions, an apparatus for tracking a TMBOC signal, and a satellite navigation signal receiver system using the same.

An object of the present invention is to provide a method of generating an unambiguous correlation function for a TMBOC(6,1,4/33) signal based on partial correlation functions, an apparatus for tracking a TMBOC signal, and a satellite navigation signal receiver system using the same, into which conventional BOC signal tracking schemes that are applied to a $BOC_{sin}(kn,n)$ or $BOC_{cos}(kn,n)$ signal have been developed.

An object of the present invention is to provide a method of generating an unambiguous correlation function for a TMBOC(6,1,4/33) signal based on partial correlation functions, an apparatus for tracking a TMBOC signal, and a satellite navigation signal receiver system using the same, which have been developed based on the unique characteristics of a TMBOC signal without using a conventional correlation function generation scheme developed for a BOC signal.

The objects of the present invention are not limited to the above-described objects, and other objects that have not been described above will be clearly understood by those skilled in the art from the following description.

In accordance with an aspect of the present invention, there is provided a delay locked loop (DLL), including:

a local signal generation unit configured to generate an early and late delayed signal pair $B(t+\tau+\Delta/2)$ and $B(t+\tau-\Delta/2)$, early and late delayed, respectively, based on phase delay $\tau$ and a delay value difference $\Delta$, with respect to a signal pulse train of a TMBOC(6,1,4/33)-modulated received signal B(t);

early and late autocorrelation units configured to generate 12 early partial correlation functions $\{P_j(\tau+\Delta/2)\}_{j=0}^{11}$ and 12 late partial correlation functions $\{P_j(\tau-\Delta/2)\}_{j=0}^{11}$ by performing autocorrelation operations of the early and late delayed signal pair with respect to a total time $T(0 \le t \le T)$;

an early sub-correlation function generation unit configured to generate an early sub-correlation function $R_0(\tau+\Delta/2)$ by performing an elimination operation between sixth and seventh early partial correlation functions $P_5(\tau+\Delta/2)$ and $P_6(\tau-o/2)$, and a late sub-correlation function generation unit configured to generate a late sub-correlation function $R_0(\tau-\Delta/2)$ by performing an elimination operation between sixth and seventh late partial correlation functions $P_5(\tau-\Delta/2)$ and $P_6(\tau-\Delta/2)$;

an early main correlation function combination unit configured to generate an early main correlation function $R_{proposed}(\tau+\Delta/2)$ by summing results obtained by performing elimination operations between the remaining 10 early partial correlation functions $\{P_j(\tau+\Delta/2)\}_{j=0,j\ne 5,6}^{11}$, excluding the sixth and seventh early partial correlation functions $P_5(\tau+\Delta/2)$ and $P_6(\tau+\Delta/2)$ from the 12 early partial correlation functions $\{P_j(\tau+\Delta/2)\}_{j=0}^{11}$, and the early sub-correlation function $R_0(\tau+\Delta/2)$;

a late main correlation function combination unit configured to generate a late main correlation function $R_{proposed}(\tau-\Delta/2)$ by summing results obtained by performing elimination operations between the remaining 10 late partial correlation functions $\{P_j(\tau-\Delta/2)\}_{j=0,j\ne 5,6}^{11}$, excluding the sixth and seventh late partial correlation functions $P_5(\tau-\Delta/2)$ and $P_6(\tau-\Delta/2)$ from the 12 late partial correlation functions $\{P_j(\tau-\Delta/2)\}_{j=0}^{11}$, and the late sub-correlation function $R_0(\tau-\Delta/2)$; and a numerical control oscillator (NCO) configured to determine a phase delay $\tau$ of a delayed signal for the received signal based on a discrimination output based on values of the early and late main correlation functions, and to output the determined phase delay $\tau$ to the local signal generation unit;

wherein the elimination operation is an operation satisfying algebraic relations in which $|A|+|B|-|A-B|=0$ when real numbers A and B are $AB \le 0$ and $|A|+|B|-|A-B|>0$ when the real numbers A and B are $AB>0$.

In accordance with an embodiment, the early partial correlation functions $\{P_j(\tau+\Delta/2)\}_{j=0}^{11}$ and the late partial correlation functions $\{P_j(\tau-\Delta/2)\}_{j=0}^{11}$ may be based on the following equation:

$$R(\tau) = \frac{1}{PT}\int_0^T B(t)B(t+\tau)dt$$

$$= \sum_{y=0}^{11}\sum_{i=-\infty}^{\infty}\frac{1}{T\sqrt{P}}\int_0^T B(t)p_i r_{T_c}(t+\tau-iT_c)s_{i,j}(t+\tau)dt$$

$$= \sum_{j=0}^{11} P_j(\tau)$$

where P is power of the TMBOC-modulated signal, $p_i \in \{-1, 1\}$ is an i-th chip of a code, for example, a PRN code, having a period T, $T_c$ is a period of a PRN code chip, $r_{T_c}(t)$ is a unit square wave present in $[0, T_c]$, and $s_{i,j}(t)$ is waveforms of 12 successive units that are present in a single PRN code chip of the TMBOC modulated signal and have a period of $T_c/12$.

In accordance with an embodiment, the early sub-correlation function $R_0(\tau+\Delta/2)$ or late sub-correlation function $R_0(\tau-\Delta/2)$ may be generated based on the following equation:

$$R_0(\tau) = |P_5(\tau)|+|P_6(\tau)|-|P_5(\tau)-P_6(\tau)|$$

In accordance with an embodiment, the early main correlation function combination unit may generate an early main correlation function $R_{proposed}(\tau+\Delta/2)$ by summing results obtained by performing an elimination operation between each of the early partial correlation functions $\{P_j 9\tau+\Delta/2)\}_{j=0}^{11}$ and the early sub-correlation function $R_0(\tau+\Delta/2)$; and the late main correlation function combination unit may generate a late main correlation function $R_{proposed}(\tau-\Delta/2)$ by summing results obtained by performing an elimination operation between each of the late partial correlation functions $\{P_j(\tau-\Delta/2)\}_{j=0}^{11}$ and the late sub-correlation function $R_0(\tau-\Delta/2)$.

In accordance with an embodiment, the discrimination function may be defined by the following equation:

$$D(\tau) = R_{proposed}^2\left(\tau+\frac{\Delta}{2}\right) - R_{proposed}^2\left(\tau-\frac{\Delta}{2}\right)$$

In accordance with another aspect of the present invention, there is provided a method of tracking a TMBOC(6,1,4/33) signal, including:

generating an early and late delayed signal pair $B(t+\tau+\Delta/2)$ and $B(t+\tau-\Delta/2)$, early and late delayed, respectively, based on a phase delay $\tau$ and a delay value difference $\Delta$, with respect to a signal pulse train of a TMBOC(6,1,4/33)-modulated received signal B(t);

generating 12 early partial correlation functions $\{P_j(\tau+\Delta/2)\}_{j=0}^{11}$ and 12 late partial correlation functions $\{P_j(\tau-\Delta/2)\}_{j=0}^{11}$ by performing autocorrelation operations of the early and late delayed signal pair with respect to a total time T(0≤t≤T);

generating an early sub-correlation function $R_0(\tau+\Delta/2)$ by performing an elimination operation between sixth and seventh early partial correlation functions $P_5(\tau-\Delta/2)$ and $P_6(\tau+\Delta/2)$, and generating a late sub-correlation function $R_0(\tau-\Delta/2)$ by performing an elimination operation between sixth and seventh late partial correlation functions $P_5(\tau-\Delta/2)$ and $P_6(\tau-\Delta/2)$;

generating an early main correlation function $R_{proposed}(\tau+\Delta/2)$ by summing results obtained by performing elimination operations between the remaining 10 early partial correlation functions $\{P_j(\tau+\Delta/2)\}_{j=0, j\neq 5,6}^{11}$, excluding the sixth and seventh early partial correlation functions $P_5(\tau+\Delta/2)$ and $P_6(\tau+\Delta/2)$ from the 12 early partial correlation functions $\{P_j(\tau+\Delta/2)\}_{j=0}^{11}$, and the early sub-correlation function $R_0(\tau+\Delta/2)$, and generating a late main correlation function $R_{proposed}(\tau-\Delta/2)$ by summing results obtained by performing elimination operations between the remaining 10 late partial correlation functions $\{P_j(\tau-\Delta/2)\}_{j=0, j\neq 5,6}^{11}$, excluding the sixth and seventh late partial correlation functions $P_5(\tau-\Delta/2)$ and $P_6(\tau-\Delta/2)$ from the 12 late partial correlation functions $\{P_j(\tau-\Delta/2)\}_{j=0}^{11}$, and the late sub-correlation function $R_0(\tau-\Delta/2)$; and determining a phase delay τ of a delayed signal for the received signal based on a discrimination output based on values of the early and late main correlation functions;

wherein the elimination operation is an operation satisfying algebraic relations in which $|A|+|B|-A-B|=0$ when real numbers A and B are AB≤0 and $|A|+|B|-|A-B|>0$ when the real numbers A and B are AB>0.

In accordance with still another aspect of the present invention, there is provided a method of generating a correlation function of a TMBOC(6,1,4/33) signal, including:

generating a signal B(t +τ) delayed based on a phase delay τ with respect to a signal pulse train of a TMBOC(6,1,4/33)-modulated received signal B(t);

generating partial correlation functions $\{P_j(\tau)\}_{j=0}^{11}$ by performing an autocorrelation operation of the received signal B(t) and the delayed signal B(t +τ) with respect to a total time T(0≤t≤T);

generating a sub-correlation function $R_0(\tau)$ by performing an elimination operation of sixth and seventh partial correlation functions $P_5(\tau)$ and $P_6(\tau)$; and generating a main correlation function $R_{proposed}(\tau)$ by summing results obtained by performing elimination operations between the remaining 10 partial correlation functions $\{P_j(\tau)\}_{j=0, j\neq 5,6}^{11}$, excluding the sixth and seventh early partial correlation functions $P_5(\tau)$ and $P_6(\tau)$ from the 12 partial correlation functions $P_j\{\tau\}_{j=0}^{11}$, and the sub-correlation function $R_0(\tau)$ wherein the elimination operation is an operation satisfying algebraic relations in which $|A|+|B|-A-B|=0$ when real numbers A and B are AB≤0 and $|A|+|B|-A-B|>0$ when the real numbers A and B are AB>0.

In accordance with an embodiment, generating the main correlation function $R_{proposed}(\tau)$ may include generating the main correlation function $R_{proposed}(\tau)$ by summing results obtained by performing an elimination operation between each of the partial correlation functions $\{P_j(\tau)\}_{j=0}^{11}$ and the sub-correlation function $R_0(\tau)$.

In accordance with still another aspect of the present invention, there is provided an apparatus for tracking a TMBOC signal, including:

a frequency offset compensation unit configured to output a compensated received signal compensated for frequency offset of a carrier frequency based on a carrier frequency compensation value with respect to a TMBOC(6,1,4/33)-modulated received signal;

a local code generation unit configured to generate a delay-compensated local code based on a code delay value;

a mixer configured to mix the delay-compensated local code with the frequency offset-compensated received signal;

a DLL configured to repeatedly track and calculate a code delay value that allows a correlation value obtained by correlating the delay-compensated local signal and the frequency offset-compensated received signal with each other is located at an apex of a main peak of a correlation function, and to provide the calculated code delay value to the local code generation unit;

a phase lock loop (PLL) configured to repeatedly calculate a carrier frequency compensation value based on an autocorrelation value of a local code, based on the tracked code delay value, so that a phase error of a carrier signal can be minimized, and to provide the carrier frequency compensation value to the frequency offset compensation unit; and a data extraction unit configured to extract spreading data from a mixture of the delay-compensated local code and the compensated received signal;

wherein the DLL operates to:

acquire a main correlation function by summing results that are obtained by performing an elimination operation between a sub-correlation function, generated through an elimination operation of sixth and seventh partial correlation functions of partial correlation functions constituting an autocorrelation function obtained when the TMBOC(6,1,4/33)-modulated received signal is construed as a pulse train composed of unit pulses having a period of $1/12*T_c$, and each of all the partial correlation functions or each of remaining partial correlation functions, excluding the sixth and seventh partial correlation functions; and wherein the elimination operation is an operation satisfying algebraic relations in which $|A|+|B|-|A-B|=0$ when real numbers A and B are AB≤0 and $|A|+|B|-|A-B|>0$ when the real numbers A and B are AB>0.

In accordance with still another aspect of the present invention, there is provided a satellite navigation signal receiver system, including:

a front end unit configured to output a received signal obtained by TMBOC(6,1,4/33)-modulating a signal in space (SIS) received from an antenna;

a baseband processing unit configured to acquire and track a code delay value with respect to the output received signal using a DLL, to compensate for carrier frequency offset using a PLL, and to extract satellite navigation data from a code delay-compensated local code and a frequency offset-compensated compensated received signal; and a navigation function processing unit configured to estimate a pseudorange based on the extracted satellite navigation data;

wherein the baseband processing unit operates to:

generate a signal B(t +τ) delayed based on a phase delay τ with respect to a signal pulse train of a TMBOC(6,1,4/33)-modulated received signal B(t);

generate partial correlation functions $\{p_j(\tau)\}_{j=0}^{11}$ by performing an autocorrelation operation of the received signal B(t) and the delayed signal B(t +τ) with respect to a total time T(0≤t≤T);

generate a sub-correlation function $R_0(\tau)$ by performing an elimination operation of sixth and seventh partial correlation functions $P_5(\tau)$ and $P_6(\tau)$; and generate a main correlation function $R_{proposed}(\tau)$ summing results obtained by performing elimination operations between the remaining 10 partial correlation functions $\{P_j(\tau)\}_{j=0, j\neq 5,6}^{11}$, excluding the sixth and seventh early partial correlation functions $P_5(\tau)$ and $P_6(\tau)$ from the 12 partial correlation functions $\{P_j(\tau)\}_{j=0}^{11}$, and the sub-correlation function $R_0(\tau)$;

wherein the elimination operation is an operation satisfying algebraic relations in which $|A|+|B|-A-B|=0$ when real numbers A and B are AB≤0 and $|A|+|B|-|A-B|>0$ when the real numbers A and B are AB>0.

The method of generating an unambiguous correlation function for a TMBOC(6,1,4/33) signal, the apparatus for tracking a TMBOC signal, and the satellite navigation signal reception system using the same according to the present invention can overcome the disadvantage of the conventional TMBOC signal track techniques in which the advantages of a BOC(6,1) signal cannot be utilized because the conventional TMBOC signal track techniques are based on a $BOC_{sin}(kn,n)$ signal or $BOC_{cos}(kn,n)$ signal, and thus can be optimally applied to a TMBOC(6,1,4/33) signal.

The method of generating an unambiguous correlation function for a TMBOC(6,1,4/33) signal, the apparatus for tracking a TMBOC signal, and the satellite navigation signal reception system using the same according to the present invention can completely eliminate side peaks, and can provide a proposed unambiguous correlation function that is sharper and higher than an autocorrelation function.

The advantages of the present invention are not limited to the above-described advantages, and other advantages that have not been described above will be clearly understood by those skilled in the art from the following description.

DETAILED DESCRIPTION

Figure 1:
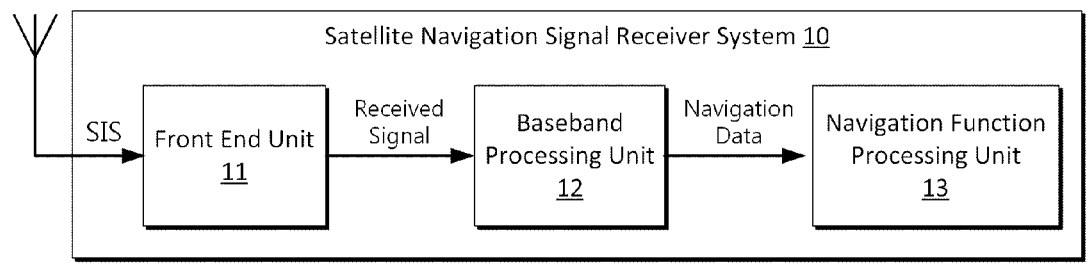
FIG. 1 is a block diagram illustrating a satellite navigation signal receiver system according to an embodiment of the present invention.

With regard to embodiments of the present invention disclosed herein, specific structural and functional descriptions are given merely for the purpose of illustrating the embodiments of the present invention. Embodiments of the present invention may be practiced in various forms, and the present invention should not be construed as being limited to embodiments disclosed herein.

Embodiments of the present invention will be described in detail below with reference to the accompanying drawings. The same reference numerals will be used to denote the same components throughout the accompanying drawings, and descriptions of the same components will be omitted.

FIG. 1 is a block diagram illustrating a satellite navigation signal receiver system 10 according to an embodiment of the present invention.

Referring to FIG. 1, the satellite navigation signal receiver system 10 includes an antenna, a front end unit 11, a baseband processing unit 12, and a navigation function processing unit 13.

A signal in space (SIS) emitted from a navigation satellite and received by the antenna is subjected to tuning, down conversion, filtering, amplification, and digital sampling by the front end unit 11, and is then output as a digital received signal.

The baseband processing unit 12 may acquire and track code delay using a delay lock loop (DLL) for acquiring and tracking signal synchronization based on a signal correlation technique with respect to the output received signal, may compensate for carrier frequency offset using a phase lock loop (PLL) in order to compensate for the fading or Doppler effect, and may extract synchronized satellite navigation data from a code delay-compensated local signal and a frequency offset-compensated received signal.

In particular, the baseband processing unit 12 may generate the pseudorange from the satellite to the satellite navigation signal receiver system 10 based on the satellite navigation data, and may output the pseudorange.

Furthermore, the baseband processing unit 12 may extract phase measurement data, satellite location data (almanac), satellite clock information, satellite orbit data (ephemeris), etc. from the compensated received signal, in addition to the pseudorange.

In this case, as will be described below, the baseband processing unit 12 of the satellite navigation signal receiver system 10 according to the present invention generates a main correlation function by summing results that are obtained by performing an elimination operation between a sub-correlation function, generated through the elimination operation of the sixth and seventh partial correlation functions of partial correlation functions constituting an autocorrelation function obtained when a TMBOC(6,1,4/33)-modulated received signal is construed as a pulse train composed of unit pulses having a period of $1/12*T_c$ (where $T_c$ is a chip period), and each of all the partial correlation functions or each of the remaining partial correlation functions, excluding the sixth and seventh partial correlation functions, and can accurately acquire and track a code phase delay based on the main correlation function having only a main peak.

The navigation function processing unit 13 may calculate the coordinates and movement of the receiver system 10 based on pseudoranges obtained for a plurality of satellites.

In this case, for example, the navigation function processing unit 13 may calculate the 2D coordinates of the satellites navigation receiver system 10 from the pseudoranges obtained for three satellites, and may calculate 3D coordinates from the pseudoranges obtained for at least four satellites.

Figure 2:
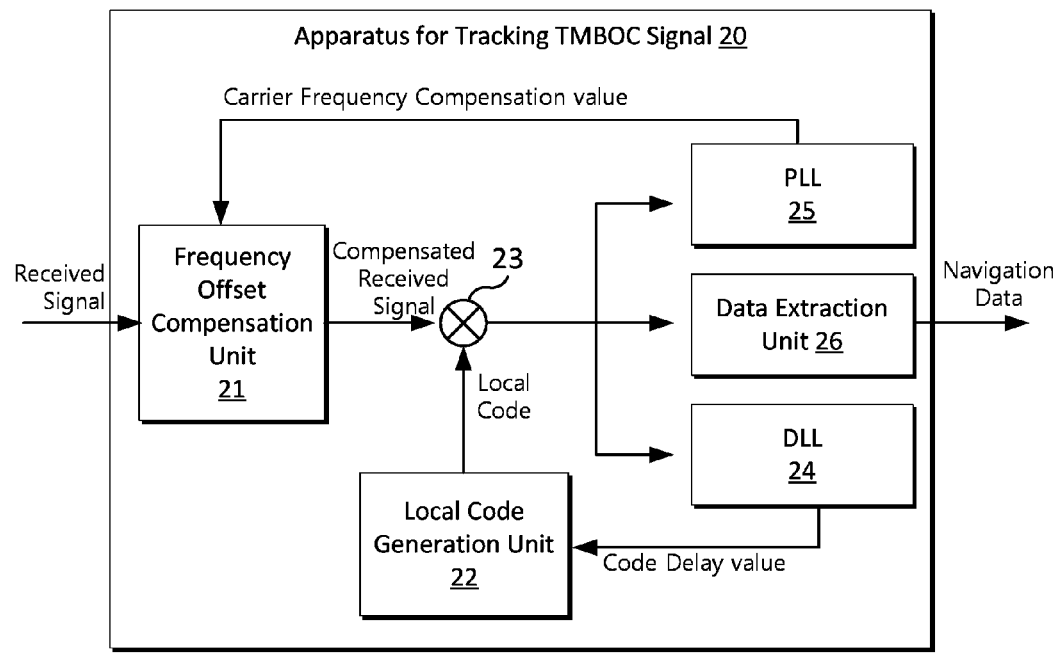
FIG. 2 is a block diagram illustrating an apparatus for tracking a TMBOC signal according to an embodiment of the present invention.

FIG. 2 is a block diagram illustrating an apparatus for tracking a TMBOC signal according to an embodiment of the present invention.

The baseband processing unit 12 of the satellite navigation signal receiver system 10 of FIG. 1 may acquire and track code delay using circuits, such as an apparatus for tracking a TMBOC signal 20 illustrated in FIG. 2.

Referring to FIG. 2, the apparatus 20 for tracking a TMBOC signal may include a frequency offset compensation unit 21, a local code generation unit 22, a mixer 23, a DLL 24, a PLL 25, and a data extraction unit 26.

When the apparatus 20 for tracking a TMBOC signal receives a TMBOC received signal, it takes time for the TMBOC received signal to reach the receiver system 10, and carrier frequency offset occurs during the propagation of the radio signal due to the fading or Doppler effect. Accordingly, in order to accurately track and demodulate the TMBOC received signal, a code delay value and carrier frequency offset should be known.

Since it is impossible to know a code delay value and a frequency offset value or they should be inaccurately estimated when a TMBOC signal is received first, the code delay value should be determined or a carrier frequency should be compensated via the DLL 24 or PLL 25.

First, the frequency offset compensation unit 21 outputs a compensated received signal obtained by compensating the TMBOC received signal for carrier frequency fading or frequency offset attributable to the Doppler effect based on a carrier frequency compensation value provided by the PLL 25. Since there is no information used to compensate for calculated carrier frequency offset in the beginning stage, a default value or a previously estimated value may be applied.

The local code generation unit 22 generates a delay-compensated local code based on a code delay value that is calculated by the DLL 24. Since there is no calculated code delay value in the beginning stage, a default value or a previously estimated value may be applied.

The mixer 23 mixes the delay-compensated local code and the frequency deviation-compensated compensated received signal.

The DLL 24 repeatedly tracks and calculates a code delay value that allows a correlation value, obtained by performing a predetermined correlation operation on the delayed received signal based on the compensated received signal and a predetermined code delay value, to be located at the main peak of a main correlation function, and provides the calculated code delay value to the local code generation unit 22.

More specifically, as will be described below in greater detail, the DLL 24 may acquire a main correlation function by summing results that are obtained by performing an elimination operation between a sub-correlation function, generated through the elimination operation of the sixth and seventh partial correlation functions of partial correlation functions constituting an autocorrelation function obtained when a TMBOC(6,1,4/33)-modulated received signal is construed as a pulse train composed of unit pulses having a period of $1/12*T$, (where $T_c$ is a chip period), and each of all the partial correlation functions or each of the remaining partial correlation functions, excluding the sixth and seventh partial correlation functions.

In this case, as will be described in connection with Equation 6, throughout the present specification and the attached claims, an elimination operation refers to an operation based on algebraic relations in which $|A|+|B|-|A-B|=0$ if real numbers A and B satisfy $xy \leq 0$ and $|A|+|B|-|A-B|>0$ if the real numbers A and B satisfy $AB>0$.

The main correlation function according to the present invention can improve tracking performance because all side peaks other than a main peak are eliminated and also the main correlation function is narrower and sharper than the autocorrelation function.

The PLL 25 repeatedly compensates a carrier frequency based on the autocorrelation value of the local code, based on the tracked code delay value, so that the phase error of a carrier signal can be minimized, and then provides a carrier frequency compensation value to the frequency offset compensation unit 21.

After the compensated received signal has been appropriately acquired and tracked, the data extraction unit 26 may accurately extract synchronized data, such as satellite navigation data modulated into a PRN code on a satellite side, from a mixture of the delay-compensated local code and the frequency deviation-compensated compensated received signal.

Furthermore, the data extraction unit 26 may estimate the pseudorange to the satellite based on the extracted satellite navigation data.

Figure 3:
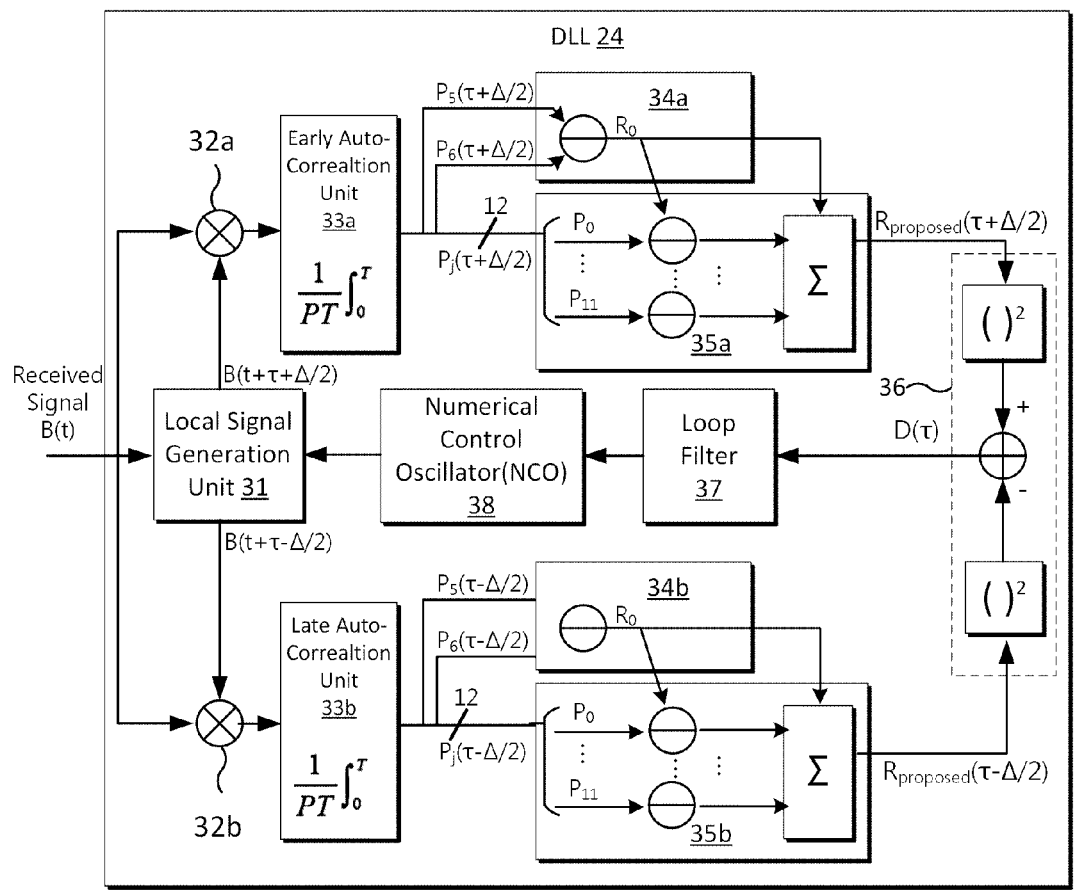
FIG. 3 is a block diagram illustrating the DLL of an apparatus for tracking a TMBOC signal according to an embodiment of the present invention.

FIG. 3 is a block diagram illustrating the DLL 24 of the apparatus for tracking a TMBOC signal according to the present embodiment.

More specifically, the DLL 24 includes a local signal generation unit 31, early and late mixers 32a and 32b, early and late autocorrelation units 33a and 33b, early and late sub-correlation function generation units 34a and 34b, early and late combination units 35a and 35b, a discriminator mixer 36, a loop filter 37, and a numerical control oscillator (NCO) 38.

The conventional apparatus for tracking a TMBOC signal performs a correlation operation on priori known spreading codes, provided by the local signal generation unit, and the received signal and then acquire a spreading code having the largest correlation value and its synchronization, at the step of acquiring the spreading code and its synchronization; and outputs the delayed received signal via a local code generation unit, performs autocorrelation on the delayed received signal and the received signal, and then finds a code delay phase that exhibits a main peak having the largest correlation value, at the step of tracking code delay after the acquisition.

As described above, the autocorrelation function of the TMBOC signal have a plurality of side peaks. In order to solve this problem, first, the early and late sub-correlation function generation units 34a and 34b of the present invention acquire a sub-correlation function generated by performing the elimination operation of the sixth and seventh partial correlation functions of partial correlation functions constituting an autocorrelation function obtained when a received signal is construed as a pulse train composed of unit pulses having a period of 1/12*$T_c$ instead of using the autocorrelation function of the received signal without change.

Next, the early and late combination units 35a and 35b of the present invention provide a main correlation function having only a main peak obtained by summing results that are obtained by performing an elimination operation between the sub-correlation function and each of all the partial correlation functions or each of the remaining partial correlation functions, excluding the sixth and seventh partial correlation functions.

In this case, the autocorrelation operation refers to an operation that multiplies a sampled signal X(t+τ) by a signal X(t) while gradually changing the delay time τ of the signal X(t) with respect to the signal X(t). Generally, when the signal X(t) repeats a specific pattern, the autocorrelation value of the signals X(t) and the X(t+τ) appears to be considerably large if the delay time τ is equal to the period of the pattern and appears to be small (that is, the correlation function appears in the form of a peak) if the delay time τ is not equal to the period of the pattern. Accordingly, when time delay for which the result of the autocorrelation operation appears to be largest is found, the value of the found time delay is the period of the signal X(t).

If a signal X(t) is a preamble indicative of the start of a synchronized signal, signal synchronization may be coarsely acquired using an autocorrelation operation.

Furthermore, after the signal synchronization has been acquired, signal synchronization may be finely tracked via an autocorrelation operation.

In general, there are some techniques for tracking the apex of the peak of a correlation function. For example, there is a technique using the aspect of changes in the values of prompt correlation based on currently applied delay time, early correlation preceding the prompt correlation, and late correlation following the prompt correlation.

For example, if correlation values appear in order of early correlation, prompt correlation and late correlation or in reverse order, the prompt correlation may be viewed as being located on a slope of a peak. If the correlation value of prompt correlation is highest and the values of early correlation and late correlation are lower than the former value, this means that the prompt correlation is located near the apex of a peak.

As described above, in the TMBOC(6,1,4/33) modulation technique, 25% of power is assigned to a data signal component, and 75% of power is assigned to a pilot signal component. The data signal component includes only $BOC_{sin}(1,1)$ $BOC_{sin}(1,1)$ signal, and a TMBOC(6,1,4/33)-modulated received signal is used only in a pilot signal component.

A TMBOC(6,1,4/33) modulated baseband received signal B(t) may be expressed by the following Equation 1:

$$B(t) = \sqrt{P} \sum_{i=-\infty}^{\infty} p_i r_{T_c}(t - iT_c) d(t) s_i(t) \qquad (1)$$

where P is the power of a TMBOC-modulated signal, $p_i \in \{-1,1\}$ is the i-th chip of a code, for example, a PRN code, having a period T, $T_c$ is the chip period of the PRN code, $r_{T_c}(t)$ is a unit square wave present in $[0, T_c]$, and d(t) is navigation data. Meanwhile, a pilot signal component does not have data, and thus the navigation data d(t) is considered to be 1.

$s_i(t)$ is the waveform of a sub-carrier that is present in the PRN code chip of the TMBOC(6,1,4/33) signal. As described above, with regard to a PRN code, symbols at four (Nos. 1, 5, 7 and 30) chip locations that belong to 33 symbols each having a period of $T_c$ are modulated into a BOC(6,1) sub-carrier waveform, and the remaining 29 symbols are modulated into a BOC(1,1) sub-carrier waveform.

When the BOC(1,1) sub-carrier waveform and the BOC(6,1) sub-carrier waveform constituting the sub-carrier $s_i(t)$ are $s_i^\alpha(t)$ and $s_i^\beta(t)$, respectively, as shown in the following Equation 2, the sub-carrier $s_i(t)$ may be expressed by following Equation 3:

$$s_i(t) = \begin{cases} s_i^\alpha(t), & (i \neq 33k, 33k+4, 33k+6, 33k+29) \\ p_i^\beta(t), & (i = 33k, 33k+4, 33k+6, 33k+29) \end{cases} \qquad (2)$$

where k is an integer.

$$\begin{cases} s_i^\alpha(t) = \sum_{m=0}^{11} (-1)^m r_{T_s^\alpha}(t - iT_c - mT_s^\alpha), \\ s_i^\beta(t) = \sum_{m=0}^{11} (-1)^m r_{T_s^\beta}(t - iT_c - mT_s^\beta) \end{cases} \qquad (3)$$

where $T_s^\alpha(t)$ is a single pulse period of the BOC(1,1) sub-carrier waveform and $T_s^\alpha = T_c/2$, $T_s^\beta(t)$ is a single pulse period of the BOC(6,1) sub-carrier waveform and $T_s^\beta = T_c/12$.

Since a half chip period pulse constituting the sub-carrier of a BOC(1,1) signal is a pulse having a period that is six times the period of a pulse constituting the sub-carrier of a BOC(6,1) signal, a single pulse of the sub-carrier of the BOC(1,1) signal may be construed as a superposition of 6 successive unit pulses having the pulse period of the sub-carrier of the BOC(6,1) signal, that is, period $T_c/12$.

Accordingly, a sub-carrier $s_i(t)$ of a single chip period may be expressed by the following Equation 4:

$$s_i(t) = \sum_{j=0}^{11} s_{i,j}(t) \qquad (4)$$

where j is the sequential positions of 12 unit pulses $s_{i,j}(t)$ within a single chip period.

Figure 4:
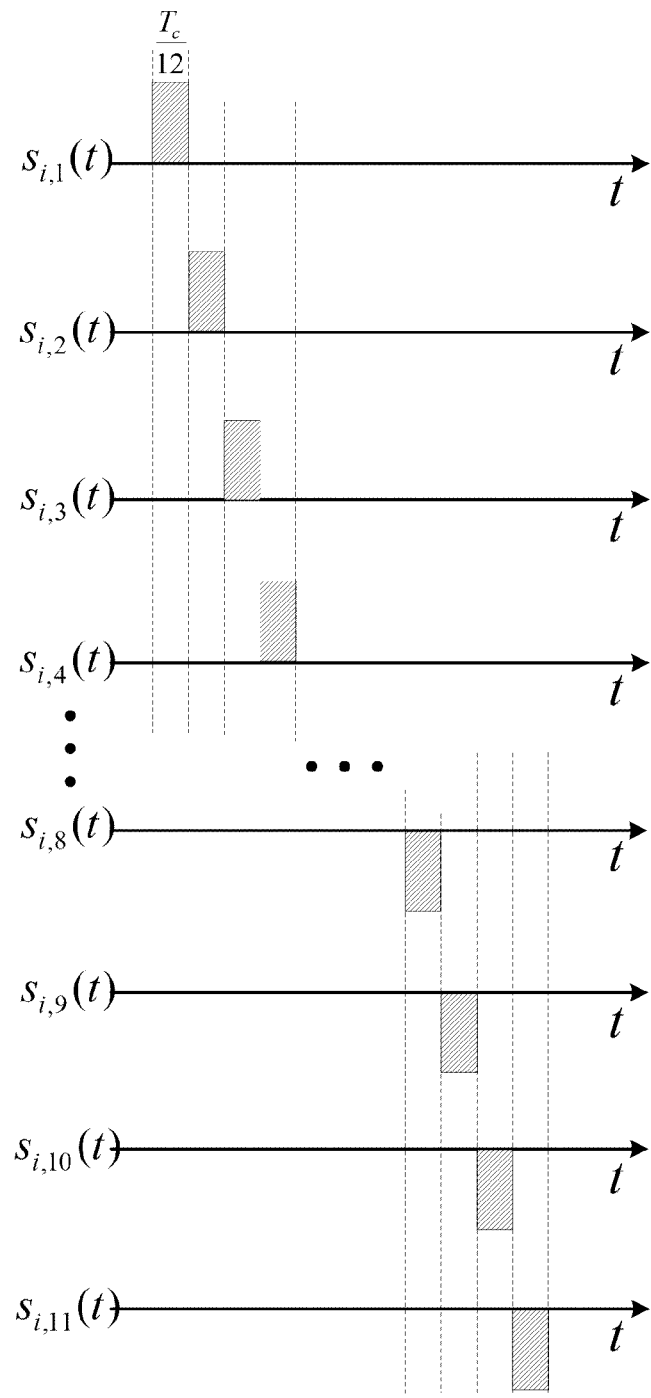
FIG. 4 is a graph illustrating sub-carrier pulses as the sum of unit pulses when the pilot component of a single chip period is a BOC(1,1) component in a TMBOC(6,1,4/33) received signal for an apparatus for tracking a TMBOC signal according to an embodiment of the present invention.
Figure 5:
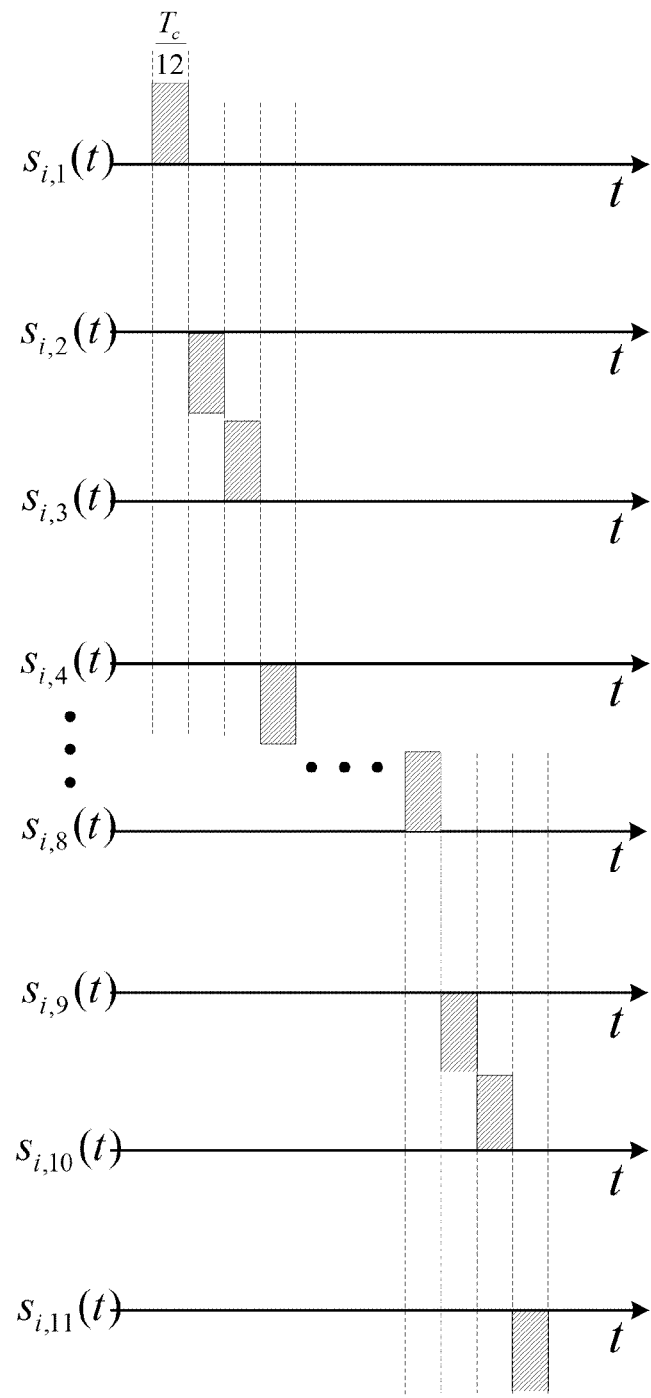
FIG. 5 is a graph illustrating sub-carrier pulses as unit pulses when the pilot component of a single chip period is a BOC(6,1) component in a TMBOC(6,1,4/33) received signal for an apparatus for tracking a TMBOC signal according to an embodiment of the present invention.

Referring to FIGS. 4 and 5 in order to more specifically illustrate the pulse waveform of the sub-carrier $s_i(t)$ based on Equation 4, FIG. 4 is a graph illustrating sub-carrier pulses as the sum of unit pulses when the pilot component of a single chip period is a BOC(1,1) component in a TMBOC(6,1,4/33) received signal for an apparatus for tracking a TMBOC signal according to an embodiment of the present invention, and FIG. 5 is a graph illustrating sub-carrier pulses as unit pulses when the pilot component of a single chip period is a BOC(6,1) component in a TMBOC(6,1,4/33) received signal for an apparatus for tracking a TMBOC signal according to an embodiment of the present invention.

In FIG. 4, the unit pulses $s_{i,j}(t)$ of the single chip period of the BOC(1,1) signal component may be construed as having a form in which 6 "+" unit pulses occur successively and then 6 "−" unit pulses occur successively.

In contrast, in FIG. 5, the unit pulses $s_{i,j}(t)$ of the single chip period of the BOC(6,1) signal component may be construed as having a form in which a "+" unit pulse and a "−" unit pulse occur alternately 6 times.

When a chip period repeats, a unit pulse appears repeatedly at the individual unit pulse locations of the two signal components. Accordingly, the received signal B(t) may be construed as a superposition of 12 unit pulse trains composed of unit pulses appearing at respective unit pulse locations.

Since the received signal is construed as the sum of 12 unit pulse trains as described above, the normalized autocorrelation function R(τ) of the TMBOC(6,1,4/33) signal B(t) may be understood as the sum of partial correlation functions $P_j(\tau)$ defined as the autocorrelation of 12 unit pulse trains, as in the following Equation 5:

$$R(\tau) = \frac{1}{PT}\int_0^T B(t)B(t+\tau)dt \qquad (5)$$

$$= \sum_{y=0}^{11}\sum_{i=-\infty}^{\infty}\frac{1}{T\sqrt{P}}\int_0^T B(t)p_i r_{T_c}(t+\tau-iT_c)s_{i,j}(t+\tau)dt$$

$$= \sum_{j=0}^{11} P_j(\tau)$$

where P is the power of the received signal B(t), and T is the period of the pseudo noise code. It is assumed that the sign +1 or −1 appears with the same probability distribution in the chip of the pseudo noise code, and the period T of the pseudo noise code may be considered to be considerably longer than the chip period $T_c$.

Figure 6:
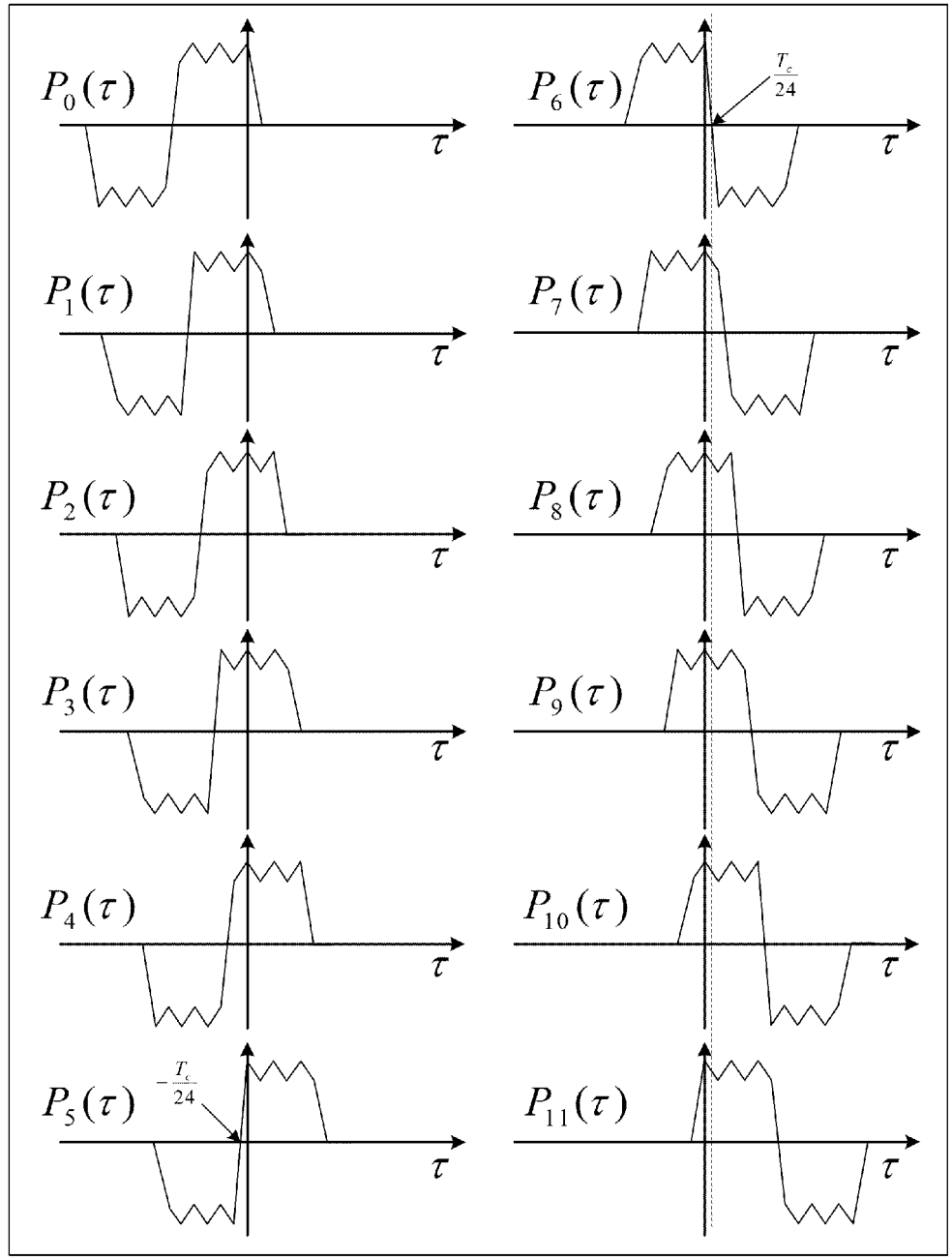
FIG. 6 is a graph illustrating 12 partial correlation functions constituting an autocorrelation function using unit pulse trains obtained by equally splitting and resolving a TMBOC (6,1,4/33) received signal for an apparatus for tracking a TMBOC signal according to an embodiment of the present invention.

Referring to FIG. 6 in order to illustrate the form of the partial correlation functions $P_j(\tau)$, FIG. 6 is a graph illustrating 12 partial correlation functions constituting an autocorrelation function using unit pulse trains obtained by equally splitting a TMBOC(6,1,4/33) received signal for an apparatus for tracking a TMBOC signal according to an embodiment of the present invention.

In FIG. 6, from the waveforms of the 12 partial correlation functions $P_j(\tau)$, it can be observed that particularly sixth and seventh partial correlation functions $P_5(\tau)$ and $P_6(\tau)$ exhibit zero-crossings close to an origin at $-T_c/24$ and $T_c/24$, respectively.

Furthermore, it can be observed that the product of the sixth and seventh partial correlation functions $P_5(\tau)$ and $P_6(\tau)$ has a positive value in the interval of $-T_c/24<\tau<T_c/24$ and has 0 or a negative value in the remaining interval. Accordingly, using algebraic relations such as the following Equation 6, waveforms in the interval of $-T_c/24<\tau 21\ T_c/24$ may be left and waveforms in the remaining interval may be eliminated:

$$\begin{cases} |A|+|B|-|A-B|=0, & \text{if } AB \le 0 \\ |A|+|B|-|A-B|>0, & \text{if } AB > 0 \end{cases} \qquad (6)$$

Throughout the present specification and the claims, the elimination operation refers to algebraic relations, such as Equation 6. The remaining waveforms other than central peak segments to be left as a main peak may be eliminated by performing an elimination operation on the partial correlation function pair.

In this case, the elimination operation of real numbers A and B in Equation 6 may be simply expressed as A⊖B.

A sub-correlation function $R_0(\tau)$ may be defined based on the sixth and seventh partial correlation functions $P_5(\tau)$ and $P_6(\tau)$, as in the following Equation 7:

$$R_0(\tau)=|P_5(\tau)|+|P_6(\tau)|-|P_5(\tau)-P_6(\tau)| \qquad (7)$$

Figure 7:
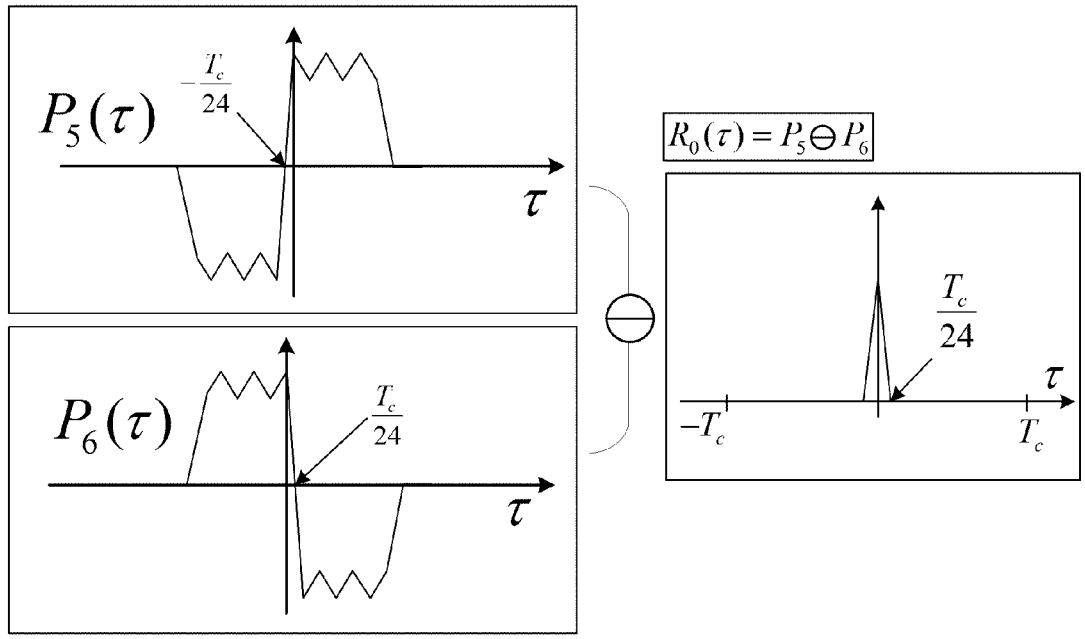
FIG. 7 illustrates a sub-correlation function that is generated by the elimination operation of two partial correlation functions corresponding to two unit pulse of a TMBOC(6,1, 4/33) received signal for an apparatus for tracking a TMBOC signal according to an embodiment of the present invention.

Temporarily referring to FIG. 7 in order to illustrate a process of obtaining the sub-correlation function $R_0(\tau)$, FIG. 7 illustrates a sub-correlation function that is generated by the elimination operation of two partial correlation functions corresponding to two unit pulse of a TMBOC(6,1,4/33) received signal for an apparatus for tracking a TMBOC signal according to an embodiment of the present invention.

In FIG. 7, the sub-correlation function $R_0(\tau)$ has a main peak having a value of $2P_5(\tau)$ in the interval of $-T_c/24<\tau<0$ and a value of $2P_6(\tau)$ in the interval of $0<\tau<T_c/24$, and has a waveform having a value of 0 in the remaining interval according to Equation 7.

Although this sub-correlation function $R_0(\tau)$ has a sharp main peak, it is calculated using only information about two of a total of 12 unit pulse trains, so that it is not desirable to generate a final main correlation function using only the sub-correlation function $R_0(\tau)$ without information about the remaining unit pulse trains.

However, with respect to the remaining partial correlation functions other than the sixth and seventh partial correlation functions $P_5(\tau)$ and $P_6(\tau)$, side peaks cannot be completely eliminated by performing an elimination operation between the partial correlation functions.

Accordingly, in order to eliminate side peaks from the remaining partial correlation functions and maximally extract only information that the peak components of an origin have from partial correlation functions, the present invention generates a main correlation function $R_{proposed}(\tau)$ by summing the results of an elimination operation between each of the remaining partial correlation functions other than the sixth and seventh partial correlation functions $P_5(\tau)$ and $P_6(\tau)$ and the sub-correlation function $R_0(\tau)$, as in the following Equation 8:

$$R_{proposed}(\tau) = \sum_{j=0, j\ne 5,6}^{j=11} |P_j(\tau)| + |R_0(\tau)| - |P_j(\tau) - R_0(\tau)| \qquad (8)$$

In an embodiment, a main correlation function $R_{proposed}(\tau)$ may be generated by summing the results of an elimination operation between each of all the partial correlation functions, including the sixth and seventh partial correlation functions $P_5(\tau)$ and $P_6(\tau)$, and the sub-correlation function $R_0(\tau)$, as in the following Equation 9:

$$R_{proposed}(\tau) = \sum_{j=0}^{j=11} |P_j(\tau)| + |R_0(\tau)| - |P_j(\tau) - R_0(\tau)| \qquad (9)$$

Figure 8:
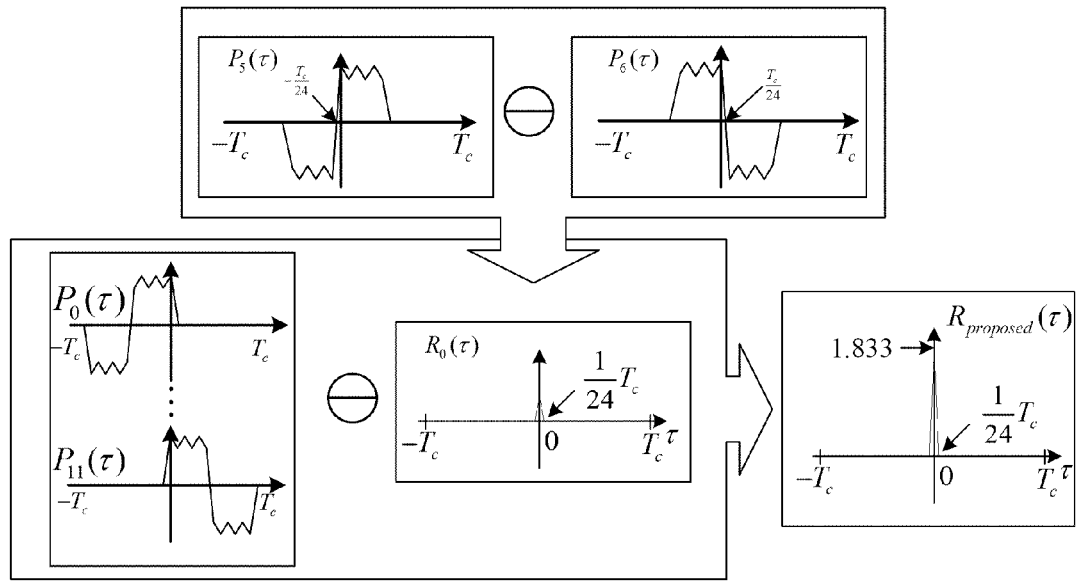
FIG. 8 illustrates a main correlation function that is generated by summing the results of an elimination operation between the sub-correlation function of a TMBOC(6,1,4/33) received signal for an apparatus for tracking a TMBOC signal according to an embodiment of the present invention and the remaining partial correlation functions.

Temporarily referring to FIG. 8 in order to schematically describe the generation of the main correlation function $R_{proposed}(\tau)$, FIG. 8 illustrates a main correlation function that is generated by summing the results of an elimination operation between the sub-correlation function of a TMBOC(6,1,4/33) received signal for an apparatus for tracking a TMBOC signal according to an embodiment of the present invention and the remaining partial correlation functions.

In FIG. 8, the sub-correlation function $R_0(\tau)$ has a positive value only in the interval of $-T_c/24<\tau<T_c/24$, and thus an elimination operation between the sub-correlation function $R_0(\tau)$ and any one partial correlation function value $P_j(\tau)$ has a value only in the interval of $-T_c/24<\tau<T_c/24$.

Accordingly, the main peak of the main correlation function $R_{proposed}(\tau)$ of FIG. 8 has a sharp shape in which the width of the base thereof is $T_c/12$ and the height thereof is about 1.8.

Figure 9:
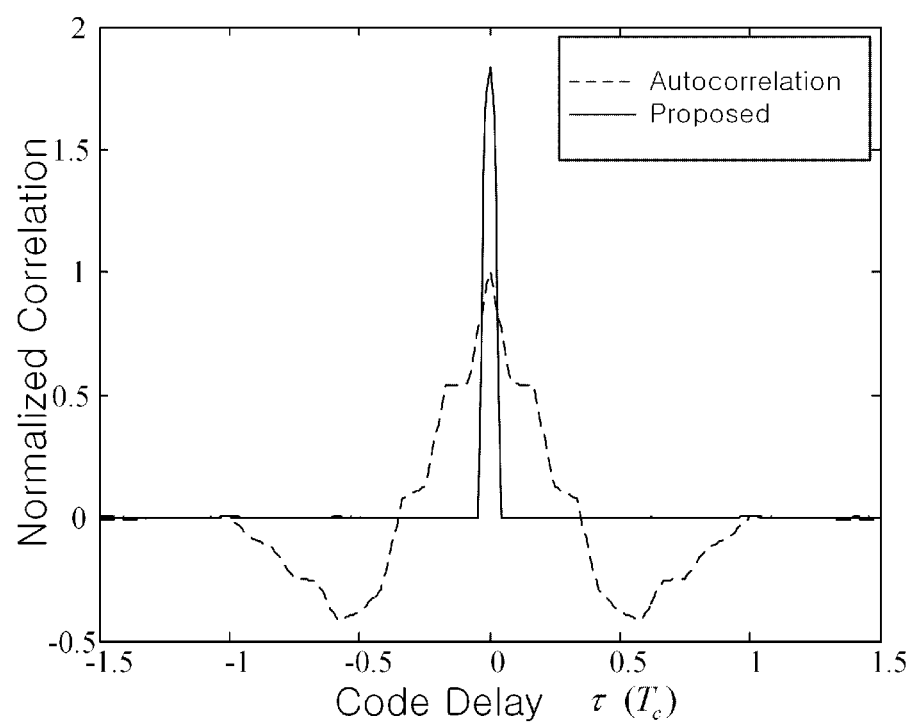
FIG. 9 is a graph illustrating the comparison between a main correlation function and an autocorrelation function that are generated as illustrated in FIG. 8 with respect to a TMBOC(6,1,4/33) received signal for the apparatus for tracking a TMBOC signal according to an embodiment of the present embodiment.

Temporarily referring to FIG. 9 in order to describe the shape and relative advantage of the main correlation function $R_{proposed}(\tau)$, FIG. 9 is a graph illustrating the comparison between a main correlation function and an autocorrelation function that are generated as illustrated in FIG. 8 with respect to a TMBOC(6,1,4/33) received signal for the apparatus for tracking a TMBOC signal according to an embodiment of the present embodiment.

In FIG. 9, in the case of the intrinsic autocorrelation function of the TMBOC(6,1,4/33) signal, side peaks are not prominent, but the slope of a main peak is not constant and changes considerably.

In contrast, in the case of the main correlation function $R_{proposed}(\tau)$ proposed by the present invention, basically all side peaks have been eliminated, the width of a main peak is $T_c/12$, (which is very narrow), the height of the main peak is about 1.83 (which is very high), and particularly the slope of the main peak has become sharper, thereby improving tracking performance.

Referring back to FIG. 3, the DLL 24 using such a main correlation function is described in greater detail.

In general, the DLL 24 determines whether two correlation values based on an early delay value preceding a desired delay value and a late delay value following the desired delay value have passed the apex of a main peak while driving a loop while gradually changing the delay values based on the two correlation values to which the early delay value and the late delay value have been applied.

In greater detail, for example, when a code delay value is gradually changed from −1 chip to +1 chip, an early correlation value based on an early delayed signal having an early delay value larger than a current delay value reaches the left slope of a main peak and passes the apex of the main peak earlier than a late correlation value based a late delayed signal having a late delay value smaller than the current delay value.

If the difference between the early correlation value and the late correlation value is tracked, the difference will continue to have a positive value, will gradually decrease from the point where the early correlation value passes the apex of the main peak when the early correlation value is located on the left slope of the main peak, will become 0 when the early correlation value and the late correlation value are symmetrical with respect to the apex, and will have a negative value when the early correlation value further proceed to the right slope of the main peak.

Through this observation, it may be said that the prompt correlation value reaches the apex at a point where the difference between the early correlation value and the late correlation value passes 0, that is, a zero-crossing point.

A discrimination function capable of discriminating the state of a prompt correlation value, such as the difference between the early correlation value and the late correlation value, is generally referred to as a discriminator. Although a discrimination function for a discriminator may be devised in various manners, a discrimination function D(t), such as that of the following Equation 11, may be used:

$$D(\tau) = R_{proposed}^2\left(\tau + \frac{\Delta}{2}\right) - R_{proposed}^2\left(\tau - \frac{\Delta}{2}\right) \quad (10)$$

where $\Delta$ is the difference between the early and late delay values.

That is, if a change in a value obtained by subtracting the square of the result of the late main correlation function from the square of the result of the early main correlation function is tracked using such a discrimination function and then zero crossing is detected, it may be determined that the main correlation function has reached the apex of the main peak at the delay value.

Next, the operation of the DLL 24 is described based on the discussion so far set forth.

First, the local signal generation unit 31 generates an early and late delayed signal pair $B(t+\tau+\Delta/2)$ and $B(t+\tau-\Delta/2)$, early and late delayed, respectively, based on phase delay $\tau$ and a delay value difference $\Delta$ provided by the NCO 38, with respect to the signal pulse train of a TMBOC(6,1,4/33)-modulated received signal B(t), and then provides them to the discriminator mixer, respectively.

The early and late mixers 32a and 32b output an early and late mixing signal pair, obtained by multiplying the received signal B(t) by the early and late delayed received signal pair $B(t+\tau+\Delta/2)$ and $B(t+\tau-\Delta/2)$, to the early and late correlation units 33a and 33b, respectively.

The early and late autocorrelation units 33a and 33b generates 12 early partial correlation functions $\{P_j(\tau+\Delta/2)\}_{j=0}^{11}$ and 12 late partial correlation functions $\{P_j(\tau-\Delta/2)\}_{j=0}^{11}$ by performing the autocorrelation operations of early and late mixing signal pair with respect to a total time $T(0 \le t \le T)$, as in Equation 5.

Thereafter, the early sub-correlation function generation unit 34a generates an early sub-correlation function $R_0(\tau+\Delta/2)$ by performing an elimination operation between sixth and seventh early partial correlation functions $P_5(\tau+\Delta/2)$ and $P_6(\tau+\Delta/2)$, as in Equation 7, and the late sub-correlation function generation unit 34b generates a late sub-correlation function $R_0(\tau-\Delta/2)$ by performing an elimination operation between sixth and seventh late partial correlation functions $P_5(\tau-\Delta/2)$ and $P_6(\tau-\Delta/2)$, as in Equation 7.

The early main correlation function combination unit 35a may generate an early main correlation function $R_{proposed}(\tau+\Delta/2)$ by summing results obtained by performing elimination operations between the remaining 10 early partial correlation functions $\{P_j(\tau+\Delta/2)\}_{j=0, j \ne 5,6}^{11}$, excluding the sixth and seventh early partial correlation functions $P_5(\tau+\Delta/2)$ and $P_6(\tau+\Delta/2)$ from the 12 early partial correlation functions $\{P_j(\tau+\Delta/2)\}_{j=0}^{11}$, and the early sub-correlation function $R_0(\tau+\Delta/2)$, as in Equation 8.

Similarly, the late main correlation function combination unit 35b may generate a late main correlation function $R_{proposed}(\tau-\Delta/2)$ by summing results obtained by performing elimination operations between the remaining 10 late partial correlation functions $\{P_j(\tau-\Delta/2)\}_{j=0, j \ne 5,6}^{11}$, excluding the sixth and seventh late partial correlation functions $P_5(\tau-\Delta/2)$ and $P_6(\tau-\Delta/2)$ from the 12 late partial correlation functions $\{P_j(\tau-\Delta/2)\}_{j=0}^{11}$, and the late sub-correlation function $R_0(\tau-\Delta/2)$, as in Equation 8.

The early and late main correlation functions $R_{proposed}(\tau+\Delta/2)$ and $R_{proposed}(\tau-\Delta/2)$ each exhibit a sharp shape in which all side peaks have been eliminated, the height of a main peak thereof is about 1.83 and the width of the base of the main peak is $T_c/12$.

In an embodiment, the early main correlation function combination unit 35a may generate the early main correlation function $R_{proposed}(\tau+\Delta/2)$ by summing results obtained by performing elimination operations between the 12 early partial correlation functions $\{P_j(\tau+\Delta/2)\}_{j=0}^{11}$ and the early sub-correlation function $R_0(\tau+\Delta/2)$, as in Equation 8.

Similarly, the late main correlation function combination unit 35b may generate the late main correlation function $R_{proposed}(\tau-\Delta/2)$ by summing results obtained by performing elimination operations between the 12 late partial correlation functions $\{P_j(\tau-\Delta/2)\}_{j=0}^{11}$ and the late sub-correlation function $R_0(\tau-\Delta/2)$, as in Equation 8.

The discriminator mixer 36 outputs an output value obtained by subtracting the square of the late main correlation function $R_{proposed}(\tau-\Delta/2)$ from the square of the early main correlation function $R_{proposed}(\tau+\Delta/2)$ in accordance with a predetermined discrimination function, for example, Equation 10.

The loop filter 37 may filter out the noise component of the discrimination output of the discriminator mixer 36.

The NCO 38 determines the phase delay $\tau$ of the delayed signal for the received signal based on the filtered discrimination output, and outputs the determined phase delay $\tau$ to the local signal generation unit 31.

For example, the NCO 38 may increase the phase delay $\tau$ a predetermined interval and then output the increased phase delay $\tau$ to the local signal generation unit 31, on the ground that if the discrimination output is a positive value larger than a predetermined threshold value, this means that an early correlation value is larger than a late correlation value and also means that the applied phase delay $\tau$ is smaller than a phase delay corresponding to the apex of a main peak in light of the shape of the main peak of a main correlation function.

Furthermore, if it is determined that the main correlation function value based on the phase delay $\tau$ is located at the apex of the main peak based on the filtered discrimination output, the NCO 38 outputs the value of the phase delay $\tau$ at the time to the local code generation unit 22 as a code delay value.

Figure 10:
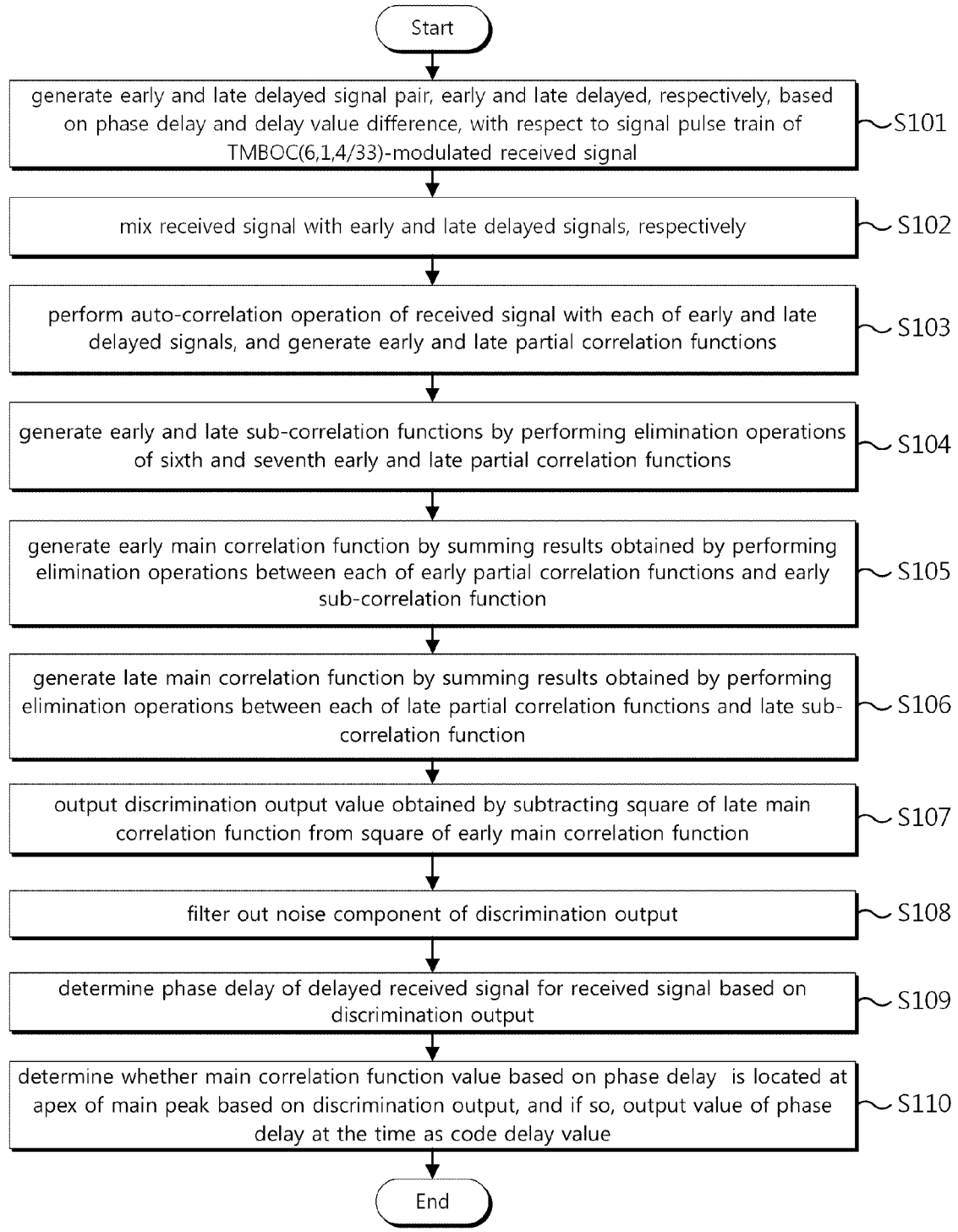
FIG. 10 is a flowchart illustrating a method of tracking a TMBOC signal according to another embodiment of the present invention.

FIG. 10 is a flowchart illustrating a method of tracking a TMBOC signal according to another embodiment of the present invention.

At step S101, an early and late delayed signal pair $B(t+\tau+\Delta/2)$ and $B(t+\tau-\Delta/2)$ early delayed and late delayed, respectively, is generated based on a phase delay $\tau$ and a delay value difference $\Delta$ provided by the NCO 38, with respect to the signal pulse train of a TMBOC(6,1,4/33)-modulated received signal $B(t)$.

At step S102, early and late mixing signal pairs obtained by multiplying the received signal $B(t)$ by the early and late delayed received signal pair $B(t+\tau+\Delta/2)$ and $B(t+\tau-\Delta/2)$ are output.

At step S103, 12 early partial correlation functions $\{P_j(\tau+\Delta/2)\}_{j=0}^{11}$ and 12 late partial correlation functions $\{P_j(\tau-\Delta/2)\}_{j=0}^{11}$ are generated by performing the autocorrelation operation of early and late mixing signal pairs with respect to a total time $T(0 \leq t \leq T)$, as in Equation 5.

At step S104, an early sub-correlation function $R_0(\tau+\Delta/2)$ is generated by performing an elimination operation between sixth and seventh early partial correlation functions $P_5(\tau+\Delta/2)$ and $P_6(\tau+\Delta/2)$, as in Equation 7, and a late sub-correlation function $R_0(\tau-\Delta/2)$ is generated by performing an elimination operation between sixth and seventh late partial correlation functions $P_5(\tau-\Delta/2)$ and $P_6(\tau-\Delta/2)$, as in Equation 7.

At step S105, an early main correlation function $R_{proposed}(\tau+\Delta/2)$ may be generated by summing results obtained by performing elimination operations between the remaining 10 early partial correlation functions $\{P_j(\tau+\Delta/2)\}_{j=0, j \neq 5,6}^{11}$ excluding the sixth and seventh early partial correlation functions $P_5(\tau+\Delta/2)$ and $P_6(\tau+\Delta/2)$ from the 12 early partial correlation functions $\{P_j(\tau+\Delta/2)\}_{j=0}^{11}$, and the early sub-correlation function $R_0(\tau+\Delta/2)$, as in Equation 8.

At step S106, a late main correlation function $R_{proposed}(\tau-\Delta/2)$ may be generated by summing results obtained by performing elimination operations between the remaining 10 late partial correlation functions $\{P_j(\tau-\Delta/2)\}_{j=0, j \neq 5,6}^{11}$, excluding the sixth and seventh late partial correlation functions $P_5(\tau-\Delta/2)$ and $P_6(\tau-\Delta/2)$ from the 12 late partial correlation functions $\{P_j(\tau-\Delta/2)\}_{j=0}^{11}$, and the late sub-correlation function $R_0(\tau-\Delta/2)$, as in Equation 8.

The early and late main correlation functions $R_{proposed}(\tau+\Delta/2)$ and $R_{proposed}(\tau-\Delta/2)$ each exhibit a sharp shape in which all side peaks have been eliminated, the height of a main peak thereof is about 1.83 and the width of the base of the main peak is $T_c/12$.

In this case, in an embodiment, at step S105, the early main correlation function $R_{proposed}(\tau+\Delta/2)$ may be generated by summing results obtained by performing elimination operations between the 12 early partial correlation functions $\{P_j(\tau+\Delta/2)\}_{j=0}^{11}$ and the early sub-correlation function $R_0(\tau+\Delta/2)$, as in Equation 8.

In an embodiment, at step S106, the late main correlation function $R_{proposed}(\tau-\Delta/2)$ may be generated by summing results obtained by performing elimination operations between the 12 late partial correlation functions $\{P_j(\tau-\Delta/2)\}_{j=0}^{11}$ and the late sub-correlation function $R_0(\tau-\Delta/2)$, as in Equation 8.

At step S107, a discrimination output value obtained by subtracting the square of the late main correlation function $R_{proposed}(\tau-\Delta/2)$ from the square of the early main correlation function $R_{proposed}(\tau+\Delta/2)$ in accordance with a predetermined discrimination function, for example, Equation 10, is output.

At step S108, the noise component of the discrimination output may be filtered out.

At step S109, the phase delay $\tau$ of the delayed signal for the received signal may be determined based on the filtered discrimination output.

Furthermore, at step S110, if it is determined that the main correlation function value based on the phase delay $\tau$ is located at the apex of a main peak based on the filtered discrimination output, the value of the phase delay $\tau$ at the time is output as a code delay value.

Figure 11:
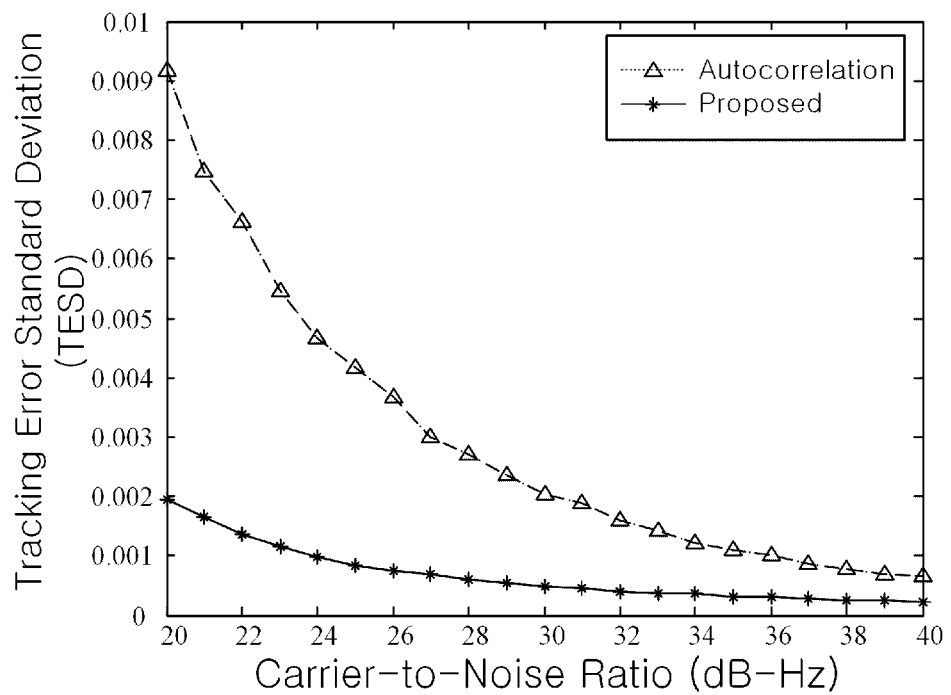
FIG. 11 is a graph illustrating the performance of the apparatus and method for tracking a TMBOC signal according to the embodiments of the present invention.

FIG. 11 is a graph illustrating the performance of the apparatus and method for tracking a TMBOC signal according to the embodiments of the present invention.

Performance index is tracking error standard deviation (TESD). The TESD of the autocorrelation function of a TMBOC(6,1,4/33) signal and TESD using a main correlation function according to the present invention were simulated within a predetermined carrier to noise ratio (CNR) range.

It can be seen that, when the TESDs were observed while the CNR was being varied, the case of performing tracking using a main correlation function according to the present invention exhibited lower TESDs than the case of performing tracking using an autocorrelation function at CNRs in all ranges of interest, and thus the case of performing tracking using a main correlation function according to the present invention exhibited excellent performance indices than the case of performing tracking using an autocorrelation function.

The above embodiments and the accompanying drawings are intended merely to clearly illustrate part of the technical spirit of the present invention, and it will be apparent to those skilled in the art that modifications and specific embodiments that those skilled in the art can easily derive from the present specification and the accompanying drawings are all included in the range of the rights of the present invention.

Furthermore, the apparatus according to the present invention may be implemented as computer-readable code stored on a computer-readable storage medium. The computer-readable storage medium includes all types of storage devices on which data that can be read by a computer system can be stored. Examples of the storage medium include ROM, RAM, an optical disk, magnetic tape, a floppy disk, hard disk, nonvolatile memory. Furthermore, the computer-readable medium may be distributed across a computer system connected over a network, and thus computer-readable code may be stored and executed in a distributed manner.

What is claimed is:

1. A delay locked loop (DLL), comprising:
a local signal generation unit configured to generate an early and late delayed signal pair B(t+τ+Δ/2) and B(t+τ−Δ/2), early and late delayed signals, respectively, based on phase delay τ and a delay value difference Δ, with respect to a signal pulse train of a TMBOC (Time-Multiplexed Binarly Offset Carrier) (6,1,4/33)-modulated received signal B(t);
early and late autocorrelation units configured to generate 12 early partial correlation functions $\{P_j(\tau+\Delta/2)\}_{j=0}^{11}$ and 12 late partial correlation functions $\{P_j(\tau-\Delta/2)\}_{j=0}^{11}$ by performing autocorrelation operations of the early and late delayed signal pair with respect to a total time T(0≤t≤T);
an early sub-correlation function generation unit configured to generate an early sub-correlation function $R_0(\tau+\tau/2)$ by performing an elimination operation between sixth and seventh early partial correlation functions $P_5(\tau+\Delta/2)$ and $P_6(\tau+\Delta/2)$, and a late sub-correlation function generation unit configured to generate a late sub-correlation function $R_0(\tau-\Delta/2)$ by performing an elimination operation between sixth and seventh late partial correlation functions $P_5(\tau-\Delta/2)$ and $P_6(\tau-\Delta/2)$;
an early main correlation function combination unit configured to generate an early main correlation function $R_{proposed}(\tau+\Delta/2)$ by summing results obtained by performing an elimination operation between each of remaining 10 early partial correlation functions $\{P_j(\tau+\Delta/2)\}_{j=0,j\neq 5,6}^{11}$, excluding the sixth and seventh early partial correlation functions $P_5(\tau+\Delta/2)$ and $P_6(\tau+\Delta/2)$ from the 12 early partial correlation functions $\{P_j(\tau+\Delta/2)\}_{j=0}^{11}$, and the early sub-correlation function $R_0(\tau+\Delta/2)$;
a late main correlation function combination unit configured to generate a late main correlation function $R_{proposed}(\tau-\Delta/2)$ by summing results obtained by performing the elimination operation between each of remaining 10 late partial correlation functions $\{P_j(\tau-\Delta/2)\}_{j=0,j\neq 5,6}^{11}$, excluding the sixth and seventh late partial correlation functions $P_5(\tau-\Delta/2)$ and $P_6(\tau-\Delta/2)$ from the 12 late partial correlation functions $\{P_j(\tau-\Delta/2)\}_{j=0}^{11}$, and the late sub-correlation function $R_0(\tau-\Delta/2)$; and
a numerical control oscillator (NCO) configured to determine a phase delay τ of a delayed signal for the received signal based on a discrimination output based on values of the early and late main correlation functions, and to output the determined phase delay τ to the local signal generation unit;
wherein the elimination operation is an operation satisfying algebraic relations in which |A|+|B|−|A −B|=0 in response to real numbers A and B being AB≤0 and |A|+|B|−|A−B|>0 in response to the real numbers A and B being AB>0.

2. The DLL of claim 1, wherein the early partial correlation functions $\{P_j(\tau+\Delta/2)\}_{j=0}^{11}$, and the late partial correlation functions $\{P_j(\tau-\Delta/2)\}_{j=0}^{11}$ are based on the following equation:

$$R(\tau) = \frac{1}{PT}\int_0^T B(t)B(t+\tau)dt$$

$$= \sum_{y=0}^{11}\sum_{i=-\infty}^{\infty}\frac{1}{T\sqrt{P}}\int_0^T B(t)p_i r_{T_C}(t+\tau-iT_c)s_{i,j}(t+\tau)dt$$

$$= \sum_{j=0}^{11} P_j(\tau)$$

where P is power of the TMBOC(Time-Multiplexed Binary Offset Carrier)—modulated signal, $p_i \in \{-1, 1\}$ is an i-th chip of a code having a period T, $T_c$ is a period of a PRN code chip, $r_{T_c}(t)$ is a unit square wave present in $[0, T_c]$, and $s_{i,j}(t)$ is waveforms of 12 successive units that are present in a single PRN code chip of the TMBOC modulated signal and have a period of $T_c/12$.

3. The DLL of claim 1, wherein the early sub-correlation function $R_0(\tau+\Delta/2)$ or late sub-correlation function $R_0(\tau-\Delta/2)$ are generated based on the following equation:

$$R_0(\tau)=|P_5(\tau)|+|P_6(\tau)-P_5(\tau)-P_6(\tau)|.$$

4. The DLL of claim 1, wherein:
the early main correlation function combination unit generates an early main correlation function $R_{proposed}(\tau+\Delta/2)$ by summing results obtained by performing an elimination operation between each of the early partial correlation functions $\{P_j(\tau+\Delta/2)\}_{j=0}^{11}$ and the early sub-correlation function $R_0(\tau+\Delta/2)$; and
the late main correlation function combination unit generates a late main correlation function $R_{proposed}(\tau-\Delta/2)$ by summing results obtained by performing an elimination operation between each of the late partial correlation functions $\{P_j(\tau-\Delta/2)\}_{j=0}^{11}$ and the late sub-correlation function $R_0(\tau-\Delta/2)$.

5. The DLL of claim 1, wherein discrimination function is defined by the following equation:

$$D(\tau) = R_{proposed}^2\left(\tau+\frac{\Delta}{2}\right) - R_{proposed}^2\left(\tau-\frac{\Delta}{2}\right).$$

6. A method of tracking a TMBOC(Time-Multiplexed Binary Offset Carrier) (6,1,4/33) signal, comprising:
generating an early and late delayed signal pair B(t+τ+Δ/2) and B(t+τ−Δ/2), early and late delayed signals, respectively, based on a phase delay τ and a delay value difference Δ, with respect to a signal pulse train of a TMBOC (6,1,4/33)-modulated received signal B(t);
generating 12 early partial correlation functions $\{P_j(\tau+\Delta/2)\}_{j=0}^{11}$ and 12 late partial correlation functions $\{P_j(\tau-\Delta/2)\}_{j=0}^{11}$ by performing autocorrelation operations of the early and late delayed signal pair with respect to a total time T(0≤t≤T);
generating an early sub-correlation function $R_0(\tau+\Delta/2)$ by performing an elimination operation between sixth and seventh early partial correlation functions $P_5(\tau+\Delta/2)$ and $P_6(\tau+\Delta/2)$, and generating a late sub-correlation function $R_0(\tau-\Delta/2)$ by performing the elimination operation between sixth and seventh late partial correlation functions $P_5(\tau-\Delta/2)$ and $P_6(\tau-\Delta/2)$;
generating an early main correlation function $R_{proposed}(\tau+\Delta/2)$ by summing results obtained by performing the elimination operation between each of remaining 10 early partial correlation functions $\{P_j(\tau+\Delta/2)\}_{j=0,j\neq 5,6}^{11}$, excluding the sixth and seventh early partial correlation functions $P_5(\tau=\Delta/2)$ and $P_6(\tau+\Delta/2)$ from the 12 early partial correlation functions $\{P_j(\tau+\Delta/2)\}_{j=0\ldots11}$, and the early sub-correlation function $R_0(\tau+\Delta/2)$, and generating a late main correlation function $R_{proposed}(\tau-\Delta/2)$ by summing results obtained by performing the elimination operation between each of remaining 10 late partial correlation functions $\{P_j(\tau-\Delta/2)\}_{j=0,j\ne 5,6}^{11}$, excluding the sixth and seventh late partial correlation functions $P_5(\tau-\Delta/2)$ and $P_6(\tau-\Delta/2)$ from the 12 late partial correlation functions $\{P_j(\tau-\Delta/2)\}_{j=0}^{11}$, and the late sub-correlation function $R_0(\tau-\Delta/2)$; and determining a phase delay $\tau$ of a delayed signal for the received signal based on a discrimination output based on values of the early and late main correlation functions;

wherein the elimination operation is an operation satisfying algebraic relations in which $|A|+|B|-|A-B|=0$ in response to real numbers A and B being $AB\le 0$ and $|A|+|B|-|A-B|>0$ in response to the real numbers A and B being $AB>0$.

7. A method of generating a correlation function of a TMBOC(Time-Multiplexed Binary Offset Carrier)(6,1,4/33) signal, comprising:

generating a signal $B(t+\tau)$ delayed based on a phase delay $\tau$ with respect to a signal pulse train of a TMBOC(6,1,4/33)-modulated received signal $B(t)$;

generating partial correlation functions $\{P_j(\tau)\}_{j=0}^{11}$ by performing an autocorrelation operation of the received signal $B(t)$ and the delayed signal $B(t+\tau)$ with respect to a total time $T(0\le t\le T)$;

generating a sub-correlation function $R_0(\tau)$ by performing an elimination operation of sixth and seventh partial correlation functions $P_5(\tau)$ and $P_6(\tau)$; and generating a main correlation function $R_{proposed}(\tau)$ by summing results obtained by performing the elimination operation between each of remaining 10 partial correlation functions $\{P_j(\tau)\}_{j=0,j\ne 5,6}^{11}$, excluding the sixth and seventh early partial correlation functions $P_5(\tau)$ and $P_6(\tau)$ from the 12 partial correlation functions $\{P_j(\tau)\}_{j=0\ldots11}$, and the sub-correlation function $R_0(\tau)$;

wherein the elimination operation is an operation satisfying algebraic relations in which $|A|+|B|-|A-B|=0$ in response to real numbers A and B being $AB\le 0$ and $|A|+|B|-|A-B|>0$ in response to the real numbers A and B being $AB>0$.

8. The method of claim 7, wherein generating the main correlation function $R_{proposed}(\tau)$ comprises generating the main correlation function $R_{proposed}(\tau)$ by summing results obtained by performing the elimination operation between each of the partial correlation functions $\{P_j(\tau)\}_{j=0}^{11}$ and the sub-correlation function $R_0(\tau)$.

9. An apparatus for tracking a TMBOC(Time-Multiplexed Binary Offset Carrier) signal, comprising:

a frequency offset compensation unit configured to output a compensated received signal compensated for frequency offset of a carrier frequency based on a carrier frequency compensation value with respect to a TMBOC(6,1,4/33)-modulated received signal;

a local code generation unit configured to generate a delay-compensated local code based on a code delay value;

a mixer configured to mix the delay-compensated local code with the frequency offset-compensated received signal;

a DLL (delay locked loop) configured to repeatedly track and calculate the code delay value that allows a correlation value obtained by correlating the delay-compensated local signal and the frequency offset-compensated received signal with each other to be located at an apex of a main peak of a correlation function, and to provide the calculated code delay value to the local code generation unit;

a phase lock loop (PLL) configured to repeatedly calculate a carrier frequency compensation value based on an autocorrelation value of a local code, based on the code delay value track by the DLL, so that a phase error of a carrier signal is minimized, and to provide the carrier frequency compensation value to the frequency offset compensation unit; and a data extraction unit configured to extract spreading data from a mixture of the delay-compensated local code and the compensated received signal;

wherein the DLL operates to:

acquire a main correlation function by summing results that are obtained by performing an elimination operation between a sub-correlation function, generated through the elimination operation of sixth and seventh partial correlation functions of partial correlation functions constituting an autocorrelation function obtained when the TMBOC(6,1,4/33)-modulated received signal is construed as a pulse train composed of unit pulses having a period of $1/12*T_c$, and each of all the partial correlation functions or each of remaining partial correlation functions, excluding the sixth and seventh partial correlation functions; and wherein the elimination operation is an operation satisfying algebraic relations in which $|A|+|B|-|A-B|=0$ in response to real numbers A and B being $AB\le 0$ and $|A|+|B|-|A-B|>0$ in response to the real numbers A and B being $AB>0$.

10. A satellite navigation signal receiver system, comprising:

a front end unit configured to output a received signal obtained by TMBOC(Time-Multiplexed Binary Offset Carrier(6,1,4/33)-modulating a signal in space (SIS) received from an antenna;

a baseband processing unit configured to acquire and track a code delay value with respect to the output received signal using a DLL (delay locked loop), to compensate for carrier frequency offset using a PLL (phase lock loop), and to extract satellite navigation data from a code delay-compensated local code and a frequency offset-compensated compensated received signal; and a navigation function processing unit configured to estimate a pseudorange based on the extracted satellite navigation data;

wherein the baseband processing unit operates to:

generate a signal $B(t+\tau)$ delayed based on a phase delay $\tau$ with respect to a signal pulse train of a TMBOC(6,1,4/33)-modulated received signal $B(t)$;

generate partial correlation functions $\{P_j(\tau)\}_{j=0}^{11}$ by performing an autocorrelation operation of the received signal $B(t)$ and the delayed signal $B(t+\tau)$ with respect to a total time $T(0\le t\le T)$;

generate a sub-correlation function $R_0(\tau)$ by performing an elimination operation of sixth and seventh partial correlation functions $P_5(\tau)$ and $P_6(\tau)$ and generate a main correlation function $R_{proposed}(\tau)$ by summing results obtained by performing the elimination operation between each of remaining 10 partial correlation functions $\{P_j(\tau)\}_{j=0,j\ne 5,6}^{11}$, excluding the sixth and seventh early partial correlation functions $P_5(\tau)$ and $P_6(\tau)$ from the 12 partial correlation functions $\{P_j(\tau)\}_{j=0}^{11}$, and the sub-correlation function $R_0(\tau)$;

wherein the elimination operation is an operation satisfying algebraic relations in which |A|+|B|−|A−B|=0 in response to real numbers A and B being AB≤0 and |A|+|B|−|A−B|>0 in response to the real numbers A and B being AB>0.

11. The system of claim 10, wherein
the baseband processing unit is configured to generate the main correlation function according to the equation $$R_{proposed}(\tau) = \sum_{j=0, j \neq 5,6}^{j=11} |P_j(\tau)| + |R_0(\tau)| - |P_j(\tau) - R_0(\tau)|.$$

12. The system of claim 10, wherein the elimination operation between the sub-correlation function $R_0(\tau)$ and any one partial correlation function value $P_j(\tau)$ comprises a value in an interval of $-T_c/24 < \tau < T_c/24$.

* * * * *